(12) United States Patent
Daibo

(10) Patent No.: US 9,564,259 B2
(45) Date of Patent: Feb. 7, 2017

(54) SUPERCONDUCTING WIRE AND SUPERCONDUCTING COIL

(71) Applicant: Fujikura Ltd., Koto-ku, Tokyo (JP)

(72) Inventor: Masanori Daibo, Sakura (JP)

(73) Assignee: FUJIKURA, LTD., Tokyo (JP)

( * ) Notice: Subject to any disclaimer, the term of this patent is extended or adjusted under 35 U.S.C. 154(b) by 351 days.

(21) Appl. No.: 14/459,473

(22) Filed: Aug. 14, 2014

(65) Prior Publication Data

US 2014/0357495 A1 Dec. 4, 2014

Related U.S. Application Data

(63) Continuation of application No. PCT/JP2013/055391, filed on Feb. 28, 2013.

(30) Foreign Application Priority Data

Feb. 29, 2012 (JP) ................................. 2012-044554

(51) Int. Cl.
| | |
|---|---|
| *H01B 12/06* | (2006.01) |
| *H01F 6/06* | (2006.01) |
| *H01L 39/04* | (2006.01) |
| *H01L 39/14* | (2006.01) |

(Continued)

(52) U.S. Cl.
CPC ............... *H01B 12/06* (2013.01); *C01G 3/006* (2013.01); *H01F 6/06* (2013.01); *H01L 39/143* (2013.01); *H01L 39/247* (2013.01)

(58) Field of Classification Search
CPC ......... H01B 12/02; H01B 12/04; H01B 12/06; H01B 12/10; H01B 12/14; H01B 7/08; H01B 7/0018; H01B 7/0216; H01B 7/0225; H01B 7/0291; H01B 3/302; H01B 3/305; H01B 3/306; H01B 3/308; H01B 3/42; H01B 3/443; H01B 3/445; H01L 39/02; H01L 39/12; H01L 39/126; H01L 39/14; H01L 39/143; H01L 39/24; H01F 6/06; H02K 3/30; H02K 3/32; Y02E 40/641; Y02E 40/642
See application file for complete search history.

(56) References Cited

U.S. PATENT DOCUMENTS

| | | | |
|---|---|---|---|
| 5,932,523 A | 8/1999 | Fujikami et al. | |
| 2004/0082482 A1* | 4/2004 | Rey .......................... | H01B 1/08 505/100 |
| 2004/0266628 A1* | 12/2004 | Lee ....................... | H01L 39/143 505/238 |

FOREIGN PATENT DOCUMENTS

| | | |
|---|---|---|
| EP | 1933334 A1 | 6/2008 |
| JP | 2000-311526 A | 11/2000 |
| JP | 2008-243588 A | 10/2008 |

(Continued)

OTHER PUBLICATIONS

Communication dated Nov. 9, 2015 from the Russian Intellectual Property Office in counterpart application No. 2014138994/02.

(Continued)

*Primary Examiner* — Colleen Dunn
(74) *Attorney, Agent, or Firm* — Sughrue Mion, PLLC

(57) ABSTRACT

A superconductor wire includes: a superconducting laminate that includes: a substrate and an intermediate layer; a superconductor layer, and a metal stabilization layer which are laminated on the substrate; and an insulation coating layer that covers an outer surface of the superconducting laminate and is formed by baking a resin material. Further, a maximum height Rz of at least a part of the outer surface of the superconducting laminate covered with the insulation coating layer is 890 nm or less.

17 Claims, 3 Drawing Sheets

(51) Int. Cl.
*C01G 3/00* (2006.01)
*H01L 39/24* (2006.01)

(56) References Cited

FOREIGN PATENT DOCUMENTS

| | | | |
|---|---|---|---|
| JP | 2008-244249 | A | 10/2008 |
| JP | 2008243588 | A | 10/2008 |
| JP | 2008244249 | A | 10/2008 |
| JP | 2010-176892 | A | 8/2010 |
| JP | 2010176892 | A | 8/2010 |
| JP | 2010-267550 | A | 11/2010 |
| JP | 2010-267822 | A | 11/2010 |
| JP | 2010267550 | A | 11/2010 |
| JP | 2010267822 | A | 11/2010 |
| JP | 2011-008949 | A | 1/2011 |
| JP | 2011008949 | A | 1/2011 |
| JP | 2011-138706 | A | 7/2011 |
| JP | 2011138706 | A | 7/2011 |
| JP | 2012-033947 | A | 2/2012 |
| JP | 2012033947 | A | 2/2012 |
| JP | 2012-216504 | A | 11/2012 |
| JP | 2012216504 | A | 11/2012 |
| KR | 10-2009-0003826 | A | 1/2009 |
| RU | 2099806 | C1 | 12/1997 |
| RU | 2340969 | C2 | 12/2008 |
| WO | 2012/005722 | A1 | 1/2012 |

OTHER PUBLICATIONS

Communication dated Mar. 24, 2016 from the European Patent Office in counterpart application No. 13755650.2.
Communication dated Jul. 30, 2015 from the European Patent Office in counterpart application No. 13755650.2.
Communication dated Jan. 27, 2015 from the Japanese Patent Office in counterpart application No. 2014-502365.
Communication dated Nov. 11, 2014, issued by the Japanese Patent Office in counterpart Japanese application No. 2014-502365.
International Search Report of PCT/JP2013/055391 dated May 14, 2013.

* cited by examiner

SUPERCONDUCTING WIRE AND SUPERCONDUCTING COIL

CROSS REFERENCE TO RELATED APPLICATIONS

This application is a continuation application based on a PCT Patent Application No. PCT/JP2013/055391, filed Feb. 28, 2013, whose priority is claimed on Japanese Patent Application No. 2012-044554, filed on Feb. 29, 2012, the entire content of which are hereby incorporated by reference.

BACKGROUND OF THE INVENTION

Field of the Invention

The present invention relates to a superconductor wire subjected to insulation coating and a superconducting coil.

Description of the Related Art

A metal-based superconductor wire formed of a material such as NbTi, which has been conventionally used, is provided in the form of a round wire, a rectangular wire, or the like. Accordingly, the degree of freedom of the shape is high. In contrast, in a high-temperature oxide superconductor wire having a critical temperature of approximately 90 to 100K, which is formed of a Bi-based or Y-based material, a superconductor layer is formed of a ceramic and the wire structure has a tape shape. Accordingly, mechanical characteristics, such as bending and twisting, are likely to deteriorate.

For example, as shown in FIG. 4, a superconductor wire 100 formed of a Bi-based material is manufactured in a structure, in which a superconductor layer 101 formed of a Bi-based material is covered with a sheath member 102 formed of Ag, using a powder in tube method (PIT method) or the like. On the other hand, the structure of a rare earth element-based (for example, Y) superconductor wire 200 is completely different as for example shown in FIG. 5.

In the superconductor wire 200 shown in FIG. 5, an oxide superconductor layer 203 is laminated on a tape-shaped metal substrate 201 with an intermediate layer 202 interposed therebetween using a deposition method, and stabilization layers 204 and 205, mode of, for example, Ag and Cu, are laminated thereon. Therefore, unlike in the case of designing a superconducting coil using a wire having a symmetrical structure in the thickness direction as in the Bi-based superconductor wire 100 shown in FIG. 4, in order to form a superconducting coil using the rare earth element-based superconductor wire 200, it is necessary to design the superconducting coil taking directivity, such as bending and twisting, in consideration.

In order to wind a tape-shaped superconductor wire to form a coil, it is necessary to cover the superconductor wire with an insulating material in order to ensure electrical insulation between superconductor wires.

As methods of insulation-coating the superconductor wire, a method of winding a resin tape, such as a polyimide tape, on the outer periphery of a tape-shaped superconductor wire and a method of forming a resin coating on the outer peripheral surface of the superconductor wire by applying a resin on the outer peripheral surface of the superconductor wire and baking the resin (refer to Japanese Unexamined Patent Application, First Publication No. 2000-311526) are known.

The technique described in Japanese Unexamined Patent Application, First Publication No. 2000-311526 is a technique applied to a Bi-based superconductor wire that is formed using the PIT method of filling material powder of the oxide superconductor into a metal tube and performing diameter reduction processing. The Bi-based superconductor wire formed by the PIT method has an elliptical cross-sectional shape as shown in FIG. 4, and a resin coating can be formed by applying a resin to the entire outer periphery of the superconductor wire and baking the resin.

In contrast, the rare earth element-based superconductor wire 200 shown in FIG. 5 has a rectangular cross-sectional shape and four corners that are angular. Therefore, in order to perform insulation coating on the superconductor wire 200, a method of forming an insulation coating by winding insulating tapes, such as polyimide tapes, so as to overlap each other or a method of forming an insulation coating by applying a thick resin layer on the outer peripheral surface and baking the resin layer has been studied.

In the superconducting coil impregnated with resin, peeling stress is applied in the vertical direction of the superconductor wire 200 during the cooling of the superconducting coil due to a difference in thermal expansion between the epoxy resin, which is an impregnating material, and the metal substrate 201 and the stabilization layer 205 formed of Cu that form the superconductor wire 200 or due to shrinkage when non-linear thermal expansion at low temperatures is taken into consideration. Accordingly, there is a possibility that the superconductor wire will deteriorate.

In addition, when performing the impregnation of epoxy resin, a process of making the epoxy resin spread out up to all corners of the coil using a vacuum impregnation method is performed. On the other hand, when resin impregnation is performed using a method other than the vacuum impregnation method, the mechanical strength (coil stiffness) of the superconducting coil may be reduced. Therefore, it is considered that the vacuum impregnation method is the most desirable.

Incidentally, when a superconducting coil is formed using a superconductor wire that is insulation-coated and the superconducting coil is impregnated with resin using a vacuum impregnation method or the like, a peeling force is applied in the vertical direction of the superconductor wire 200 due to the thermal expansion difference as described above. In the rare earth element-based superconductor wire 200 in which a number of layers are laminated as described above, there have been cases where the strength opposing the peeling stress decreases.

For example, in the case of a structure in which the intermediate layer 202, the oxide superconductor layer 203, and the stabilization layers 204 and 205 are laminated on the metal substrate 201, there is a possibility that a part of the intermediate layer 202 or the superconductor layer 203 will be peeled off due to the action of the peeling stress described above.

The present invention has been made in view of such a situation in the related art, and it is an object of the present invention to provide a superconductor wire having a laminated structure in which peeling does not occur in a part of each of an intermediate layer and a superconductor layer even if peeling stress is applied due to coil processing.

SUMMARY

In order to solve the above-described problem, a superconductor wire according to a first aspect of the present invention includes: a superconducting laminate that includes: a substrate; and an intermediate layer, a superconductor layer, and a metal stabilization layer which are laminated on the substrate; and an insulation coating layer that covers an outer surface of the superconducting laminate and is formed by baking a resin material. A maximum height Rz of at least a part of the outer surface of the superconducting laminate covered with the insulation coating layer is 890 nm or less.

If the maximum height of the outer surface of the superconducting laminate with which the insulation coating layer is in close contact is 890 nm or less, the insulation coating layer adheres to the outer surface of the superconducting laminate with appropriate adhesion. Therefore, even if stress is applied to the superconductor wire including the insulation coating layer and a force is applied in a direction in which each layer is peeled off, peeling in the intermediate layer and the superconductor layer is suppressed because peeling occurs at the interface between the insulation coating layer and the stabilization layer. Therefore, even if the superconductor wire is processed into the superconducting coil, is fixed by the impregnating resin, is cooled with a refrigerant, and is subject to a thermal stress due to a difference in the thermal expansion coefficient between the metal and the resin, it is possible to provide a superconducting coil in which there is no peeling in the intermediate layer and the superconductor layer.

In addition, if the entire periphery of the superconducting laminate is covered by the insulation coating layer, it is possible to provide a superconducting coil having a structure capable of preventing the infiltration of moisture thereinto from the outside.

The surface roughness Ra of at least a part of the outer surface of the superconducting laminate covered with the insulation coating layer may be 80 nm or less.

If the surface roughness Ra of the outer surface of the superconducting laminate with which the insulation coating layer is in close contact is 80 nm or less, the insulation coating layer adheres to the outer surface of the superconducting laminate with appropriate adhesion. Therefore, even if stress is applied to the superconductor wire including the insulation coating layer and a force for peeling each layer off is applied, peeling off of each of the intermediate layer and the superconductor layer from the layer in close contact therewith is suppressed because peeling occurs at the interface between the insulation coating layer and the superconducting laminate.

At least a part of the outer surface of the superconducting laminate may include an outer surface of a layer laminated on an outer side of the superconductor layer.

Since the outer surface of the superconducting laminate that defines the maximum height or the surface roughness is a portion laminated on the outer side of the superconductor layer, the stress applied in a direction causing delamination is reduced by peeling off of the insulation coating layer from the superconducting laminate. As a result, peeling off of each of the intermediate layer and the superconductor layer from the layer in close contact therewith is suppressed.

The metal stabilization layer may include a first stabilization layer and a second stabilization layer laminated on the first stabilization layer. The second stabilization layer may be formed by a metal tape or the metal tape and a bonding material, and an outer surface of the metal tape or an outer surface of the bonding material may be covered with the insulation coating layer.

When the metal stabilization layer is a two-layer structure of the first and second stabilization layers, it is possible to provide a structure with exceedingly stable superconducting characteristics while realizing the stress reduction described above.

The metal stabilization layer may include a first stabilization layer, which is coated on the superconductor layer, and a second stabilization layer, which is provided so as to surround a periphery of the substrate, the intermediate layer, the superconductor layer, and the first stabilization layer and which is formed by a metal tape. An outer surface of the second stabilization layer may be covered with the insulation coating layer.

If the superconductor wire includes the second stabilization layer of the metal tape provided so as to surround the periphery of the substrate, the intermediate layer, the superconductor layer, and the first stabilization layer, the stress applied in a direction causing delamination is reduced by peeling off of the insulation coating layer from the superconducting laminate. As a result, peeling off of each of the intermediate layer and the superconductor layer from the layer in close contact therewith is suppressed. In addition, the second stabilization layer of the metal tape acts as a bypass when shunting the current flowing through the superconductor layer.

The metal stabilization layer may include a first stabilization layer, a second stabilization layer provided so as to surround a periphery of the substrate, the intermediate layer, the superconductor layer, and the first stabilization layer, and a third stabilization layer provided along one surface of the second stabilization layer. Outer surfaces of the second and third stabilization layers may be covered with the insulation coating layer.

If the superconductor wire includes the third stabilization layer in addition to the first and second stabilization layers, the cross-sectional area of the metal stabilization layer when shunting the current flowing through the superconductor layer can be ensured as much as possible while realizing the stress reduction described above. Therefore, stability is improved.

The metal stabilization layer may include a first stabilization layer coated on the superconductor layer, a second stabilization layer provided so as to surround a periphery of the substrate, the intermediate layer, the superconductor layer, and the first stabilization layer, and a bonding layer laminated on an outer surface of the second stabilization layer. An outer surface of the bonding layer may be covered with the insulation coating layer.

Since the superconductor wire includes the bonding layer in addition to the first and second stabilization layers and the maximum height or the surface roughness of the outer surface of the bonding layer falls within the defined range, the stress applied in a direction causing delamination is reduced by peeling of the insulation coating layer from the bonding layer. As a result, it is possible to suppress peeling off of each of the intermediate layer and the superconductor layer from the layer in close contact therewith.

A superconducting coil according to a second aspect of the present invention is formed by the superconductor wire having any of the structures described above.

According to the aspect of the present invention, the maximum height Rz of the outer surface of the superconducting laminate with which the insulation coating layer is in close contact is set to 890 nm or less, so that the adhesion strength between the superconducting laminate and the insulation coating layer does not become unnecessarily high. Accordingly, when peeling stress is applied to the insulation coating layer, it is possible to provide a structure in which there is no peeling off of the insulation coating layer and a portion of the base and no peeling off of a part of each of the intermediate layer and the superconductor layer from the layer in close contact therewith.

Therefore, even if the superconductor wire according to the aspect of the present invention is formed into a coil and is fixed with impregnating resin, it is possible to provide a superconductor wire in which there is no peeling in a laminated portion of the intermediate layer of the superconducting laminate and a laminated portion of the superconductor layer.

DETAILED DESCRIPTION OF THE PREFERRED EMBODIMENTS

Hereinafter, a superconductor wire according to an embodiment of the present invention will be described with reference to the diagrams. However, the present invention is not limited to the embodiment described below.

First Embodiment

Figure 1:
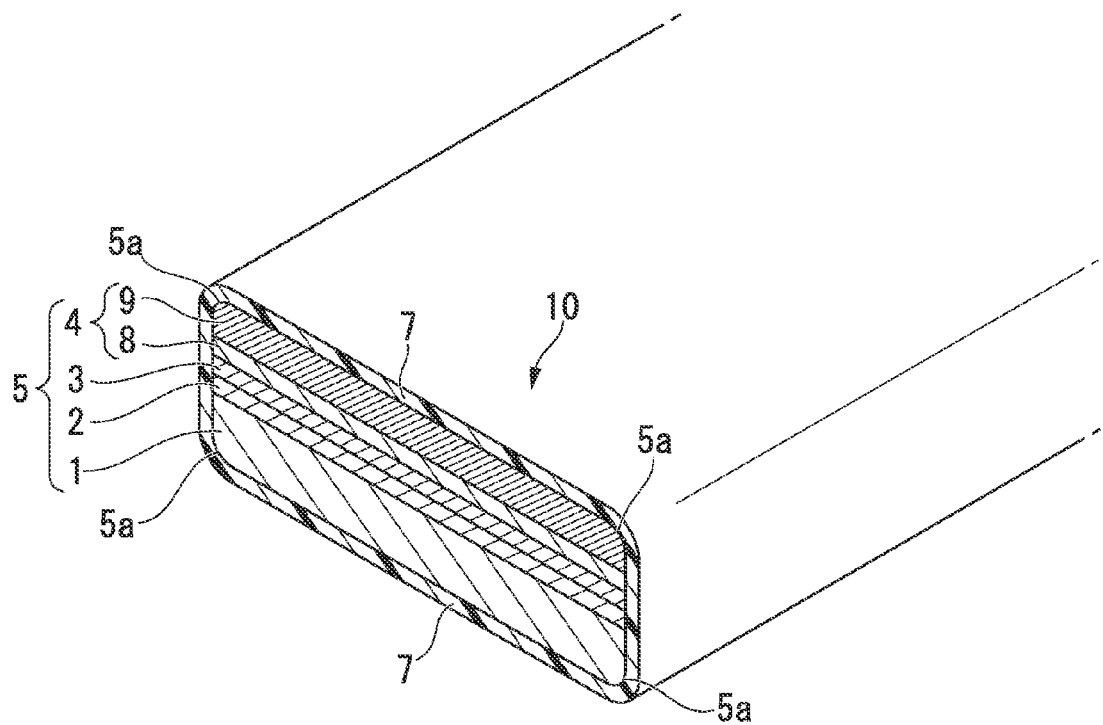
FIG. 1 is a schematic cross-sectional view showing a superconductor wire according to a first embodiment of the present invention.

FIG. 1 is a perspective view of a partial cross section along the width direction of a superconductor wire according to a first embodiment of the present invention. In a superconductor wire 10 shown in FIG. 1, a superconducting laminate 5 is formed by laminating an intermediate layer 2, an oxide superconductor layer 3, and a metal stabilization layer 4 in this order on one surface of a substrate 1. That is, the intermediate layer 2 is formed on one surface of the substrate 1, the oxide superconductor layer 3 is formed on the outer side of the intermediate layer 2, and the metal stabilization layer 4 is formed on the outer side of the oxide superconductor layer 3. In addition, the superconductor wire 10 is formed by covering the entire outer surface of the superconducting laminate 5 with an insulation coating layer 7. In the present embodiment, the metal stabilization layer 4 is formed by a first stabilization layer 8 formed on the oxide superconductor layer 3 and a second stabilization layer 9 formed on the first stabilization layer 8. Here, in the present application, the outer side refers to a side of each layer (element) opposite a side on which the substrate is provided, and the outer surface refers to a surface exposed to the outside of each layer (element).

For the substrate 1, a substrate that can be used as a substrate of a normal superconductor wire is preferable, and preferably has a long tape shape. The substrate 1 is preferably formed of heat-resistant metal. Among heat-resistant metals, a nickel (Ni) alloy is more preferable. Among these, Hastelloy (product name, manufactured by U.S. Haynes Co.) is preferred if commercially available, and it is possible to use any type of Hastelloy B, C, G, N, and W having different amounts of components of molybdenum (Mo), chromium (Cr), iron (Fe), cobalt (Co), and the like. In addition, using an oriented metal substrate, which is formed by introducing a texture into nickel alloy or the like, as the substrate 1, the intermediate layer 2 and the oxide superconductor layer 3 may also be formed on the oriented metal substrate. The thickness of the substrate 1 may be appropriately adjusted depending on the desired outcome. Normally, 10 to 500 μm is preferable, and 20 to 200 μm is more preferable.

The intermediate layer 2 controls the crystal orientation of the oxide superconductor layer 3 to prevent the diffusion of metal elements of the substrate 1 to the oxide superconductor layer 3 side. In addition, preferably, the intermediate layer 2 functions as a buffer layer to reduce the difference between the physical characteristics (a thermal expansion coefficient, a lattice constant, and the like) of the substrate 1 and the oxide superconductor layer 3, and the material of the intermediate layer 2 is a metal oxide whose physical characteristics show intermediate values between the substrate 1 and the oxide superconductor layer 3.

In particular, metal oxides, such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$, can be exemplified as materials of the intermediate layer 2.

The intermediate layer 2 may be a single layer, or may be a multi-layer structure. For example, it is preferable that a layer formed of the metal oxide (metal oxide layer) have a crystal orientation. In the case of a multi-layer structure, it is preferable that at least the outermost layer (layer closest to the oxide superconductor layer 3) have a crystal orientation.

The intermediate layer 2 may have a multi-layer structure in which a bed layer is interposed on the substrate 1 side. The bed layer is a layer that has high heat resistance, is used to reduce the interfacial reactivity, and is used to obtain the orientation of the film disposed thereon. Such a bed layer is disposed when necessary, and is formed of, for example, of yttria ($Y_2O_3$), silicon nitride ($Si_3N_4$), or aluminum oxide ($Al_2O_3$, also referred to as "alumina"). The thickness of the bed layer is, for example, 10 to 200 nm.

The intermediate layer 2 may have a multi-layer structure in which a diffusion barrier layer and a bed layer are laminated on the substrate 1 side. In this case, the intermediate layer 2 has a structure in which the diffusion barrier layer is interposed between the substrate 1 and the bed layer. The diffusion barrier layer is formed in order to prevent the diffusion of elements of the substrate 1. The material of the diffusion barrier layer is silicon nitride ($Si_3N_4$), aluminum oxide ($Al_2O_3$), or rare earth metal oxides, and the thickness of the diffusion barrier layer is 10 to 400 nm. As an example of a case where the diffusion barrier layer is interposed between the substrate 1 and the bed layer, a combination in which $Al_2O_3$ is used as the diffusion barrier layer and $Y_2O_3$ is used as the bed layer, is exemplary.

The intermediate layer 2 may have a multi-layer structure in which a cap layer is further laminated on the metal oxide layer. The cap layer has a function of controlling the orientation of the oxide superconductor layer 3, a function of suppressing the diffusion of elements forming the oxide superconductor layer 3 into the intermediate layer 2 and the reaction of gas and the intermediate layer 2 when laminating the oxide superconductor layer 3, and the like.

Preferably, the cap layer is formed through a process in which epitaxial growth from the surface of the metal oxide layer is performed and then grain growth (overgrowth) in a horizontal direction (planar direction) is performed so that crystal grains selectively grow in the in-plane direction. By such a cap layer, an in-plane orientation that is higher than that in the case of the metal oxide layer is obtained.

The material of the cap layer is not particularly limited as long as the above-described functions can be realized. In particular, $CeO_2$, $Y_2O_3$, $Al_2O_3$, $Gd_2O_3$, $Zr_2O_3$, $Ho_2O_3$, and $Nd_2O_3$ are preferable. When the material of the cap layer is $CeO_2$, the cap layer may contain a Ce-M-O-based oxide in which some of the Ce is replaced with other metal atoms or metal ions.

The thickness of an intermediate layer 12 may be appropriately adjusted depending on the desired outcome. Normally, the thickness of the intermediate layer 12 is 0.1 to 5 μm.

The intermediate layer 12 can be laminated using known methods, such as physical vapor deposition methods including an ion beam assisted deposition method (hereinafter, abbreviated as an IBAD method); a chemical vapor deposition method (CVD method); a metal organic decomposition method (MOD method); and thermal spraying. In particular, the metal oxide layer formed by the IBAD method is preferable in that the crystal orientation is high and the effect of controlling the crystal orientation of the oxide superconductor layer 3 and the cap layer is high.

As the material of the oxide superconductor layer 3, materials for forming an oxide superconductor having a composition that is commonly known can be widely applied. Materials represented by $REBa_2Cu_3O_y$ (RE indicates rare earth elements, such as Y, La, Nd, Sm, Er, and Gd), and specifically, Y123 ($YBa_2Cu_3O_y$) or Gd123 ($GdBa_2Cu_3O_y$) are exemplary examples.

The oxide superconductor layer 3 can be laminated using physical vapor deposition methods, such as a sputtering method, a vacuum deposition method, a laser deposition method, and an electron beam deposition method; a chemical vapor deposition method (CVD method); and a metal organic decomposition method (MOD method). Among these, the laser deposition method is preferable.

It is preferable that the thickness of the oxide superconductor layer 3 be approximately 0.5 to 5 μm, and that a uniform thickness be achieved.

The first stabilization layer 8 laminated on the oxide superconductor layer 3 is formed of a familiar metal material having good electrical conductivity and low contact resistance for the oxide superconductor layer 3, such as Ag or another precious metal. In the case of the first stabilization layer 8 formed of Ag, the thickness is approximately 1 to 30 μm.

The second stabilization layer 9 laminated on the first stabilization layer 8 is formed of a metal material having high conductivity, and functions as a bypass, to which the current of the oxide superconductor layer 3 is commutated, together with the first stabilization layer 8 when the oxide superconductor layer 3 is transitioned from the superconducting state to the normal conducting state.

As a metal material that forms the second stabilization layer 9, any material having high conductivity can be used. Although the material of the second stabilization layer 9 is not particularly limited, it is preferable to use a relatively inexpensive material, such as copper, copper alloys including brass (Cu—Zn alloy) and Cu—Ni alloy, or stainless steel. Among these, copper is preferable since it has high conductivity and is inexpensive.

When the oxide superconductor wire 10 is used for a superconducting fault current limiter, the second stabilization layer 9 is formed of a resistive metal material, and an Ni-based alloy, such as Ni—Cr, can be used.

The method of forming the second stabilization layer 9 is not particularly limited. For example, the second stabilization layer 9 can be laminated by bonding a metal tape, which is formed of a highly conductive material such as copper, on the first stabilization layer 8 using a bonding material, such as solder. As another method of forming the second stabilization layer 9, a metal tape may be provided without a bonding material. In addition, a metal tape having a surface covered with a bonding material may be used as the second stabilization layer 9.

The maximum height (maximum height roughness) Rz (JIS B 0601:2001) of the outer surface of the second stabilization layer 9, that is, the upper surface and both side surfaces of the second stabilization layer 9 shown in FIG. 1 is set to 890 nm or less. The maximum height of the outer surface of the second stabilization layer 9 is preferably 887 nm or less, and more preferably in the range of 189 to 887 nm.

The surface roughness (arithmetic average roughness) Ra (JIS B 0601:2001) of the outer surface of the second stabilization layer 9 is preferably 80 nm or less. The surface roughness Ra of the outer surface of the second stabilization layer 9 is more preferably in the range of 30 to 77 nm. It is more preferable that the outer surface of the second stabilization layer 9 satisfy the range of the maximum height Rz described above and satisfy the range of the surface roughness Ra described above.

The insulation coating layer 7 is in close contact with the outer surface of the second stabilization layer 9, but the state of the unevenness of the outer surface of the second stabilization layer 9 affects the adhesion of the insulation coating layer 7. When the unevenness of the outer surface of the second stabilization layer 9 is large, an anchor effect is caused by the large unevenness. Accordingly, the adhesion of the insulation coating layer 7 is increased. On the other hand, when the unevenness is small, the adhesion of the insulation coating layer 7 is reduced. When the stress is applied in a direction of delamination for the oxide superconductor wire 10, if the unevenness of the outer surface is too large and accordingly the adhesion of the insulation coating layer 7 is too large, a part of each of the intermediate layer 2 and the superconductor layer 3 may be peeled off from a layer in close contact therewith without being peeled off at the boundary between the second stabilization layer 9 and the insulation coating layer 7. For this reason, adhesion, which is required for the insulation coating layer 7 and which causes peeling at the interface between the insulation coating layer 7 and the second stabilization layer 9 without causing the peeling of each of the intermediate layer 2 and the superconductor layer 3 from the layer in close contact therewith when stress is applied, is preferable. Therefore, it is preferable to set the maximum height and the surface roughness of the outer surface of the second stabilization layer 9 to fall within the range described above.

Next, as the solder that can be used when forming the second stabilization layer 9 by laminating a metal tape on the first stabilization layer 8 using the solder, it is possible to use the solder known in the related art without being particularly limited. For example, lead-free solder containing Sn as a main component, such as Sn—Ag-based alloy, Sn—Bi-based alloy, Sn—Cu-based alloy, or Sn—Zn-based alloy, Pb—Sn-based alloy solder, eutectic solder, low-temperature solder, and the like can be utilized. One or two or more kinds of solder can also be used in combination. Among these, it is preferable to use solder having a melting point of 300° C. or lower. In this case, since it is possible to solder the metal tape and the first stabilization layer 8 at a temperature of 300° C. or lower, it is possible to prevent the characteristics of the oxide superconductor layer 3 from deteriorating due to the heat of soldering.

The thickness of the second stabilization layer 9 is not particularly limited, and can be appropriately adjusted. Preferably, the thickness of the second stabilization layer 9 is 10 to 300 μm.

In the superconducting laminate 5 having an approximately rectangular cross-sectional shape in which the substrate 1, the intermediate layer 2, the oxide superconductor layer 3, the first stabilization layer 8, and the second stabilization layer 9 are laminated, it is preferable that all corner portions 5a of the four corners in the cross-section along the width direction are curved surfaces having a radius of curvature. Since the corner portion 5a is a curved surface having a radius of curvature, it is possible to apply and bake (cure) the resin uniformly on the entire outer periphery including the corner portions 5a of the superconducting laminate 5 when forming the insulation coating layer 7 to be described later. Therefore, it is possible to form the insulation coating layer 7 that completely covers the entire outer periphery of the superconducting laminate 5. In this case, the superconducting laminate 5 can be completely sealed from the outside by the insulation coating layer 7. In the superconductor wire 10 of the structure shown in FIG. 1, both corner portions on the bottom surface side of the substrate 1 are curved surfaces and both corner portions on the upper surface side of the second stabilization layer 9 are curved surfaces, and a total of four corner portions 5a are formed. It is preferable that the radius of curvature of each corner portion 5a be set in a range of 15 to 150 μm.

As a method for processing the corner portion 5a of the superconducting laminate 5 into a curved surface, a chamfering method known in the related art can be applied. For example, each corner portion of the superconducting laminate 5 can be processed into a corner portion having a desired radius of curvature by polishing using a polishing device or a tool, such as a rasp.

When processing the corner portion 5a of the superconducting laminate 5 into a curved surface, the corner portion may be processed after forming the superconducting laminate 5. In addition, the superconducting laminate 5 may be formed by laminating each layer after processing both the corner portions of the substrate 1 and both the corner portions of the second stabilization layer 9 into curved surfaces in advance.

The insulation coating layer 7 that covers the entire outer periphery of the superconducting laminate 5 is formed by applying and then baking (curing) the resin on the entire outer periphery of the superconducting laminate 5, and the thickness is preferably set to 12 μm or more, for example.

Although the upper limit of the thickness of the insulation coating layer 7 is not particularly limited, it is preferable to set the thickness to 20 μm or less. By setting the thickness of the insulation coating layer 7 to 20 μm or less, it is possible to reduce the area of the insulation coating layer 7 occupying the cross-sectional area of the superconductor wire 10. Therefore, it is possible to reduce the size of the superconductor wire 10, and it is possible to suppress a reduction in current density by securing the required cross-sectional area of the superconductor layer 3 when the superconductor wire 10 is coil-processed.

The resin that forms the insulation coating layer 7 is not particularly limited as long as a layer can be formed by baking (curing). For example, formal resin, urethane resin, polyimide resin, polyamide-imide resin, polyester resin, polyether ether ketone resin (PEEK resin), and fluorine resin such as polytetrafluoroethylene (four fluorinated resin, PTFE) can be utilized.

Among these, a resin that can be baked at a temperature of 200° C. or lower, for example, 170 to 200° C. is preferable. By using such a resin, the baking temperature does not become too high when forming the insulation coating layer 7. Accordingly, the second stabilization layer 9 that is formed by bonding a metal tape using solder or the like does not peel off due to the melting of the solder.

The baking of the resin when forming the insulation coating layer 7 is preferably performed at a temperature of 200° C. or lower, for example, 170 to 200° C., and the baking time may be appropriately adjusted. By baking the resin under such conditions, it is possible to suppress the peeling of the second stabilization layer 9 due to the melting of solder and the deterioration of the oxide superconductor layer 3.

The method of applying the resin is not particularly limited, and it is possible to apply methods known in the related art, such as a dip coating method or a spray coating method.

In the method of forming the insulation coating layer 7 on the superconducting laminate 5, coating and baking of the resin may be performed only once, or coating and baking of the resin may be repeated multiple times until the insulation coating layer 7 having a desired thickness is formed.

In the high-temperature superconductor wire 10 of the present embodiment, it is possible to realize a structure in which the entire outer periphery including the corner portion 5a of the superconducting laminate 5 is completely covered by the insulation coating layer 7. Accordingly, in the high-temperature superconductor wire 10 of the present embodiment, since the superconducting laminate 5 is sealed from the outside by the insulation coating layer 7, it is possible to reduce moisture or the like from penetrating the oxide superconductor layer 3. As a result, it is possible to suppress the deterioration of the superconducting characteristics. A part of the composition of the rare earth oxide superconductor is susceptible to moisture since it reacts therewith. Therefore, the influence of moisture can be eliminated by covering the part completely with the insulation coating layer 7.

In addition, when the oxide superconductor wire 10 is wound around a bobbin as a coil and is then fixed with impregnating resin and cooled to the critical temperature or lower with a refrigerant, stress is applied due to a difference in the thermal expansion between metal and resin because the substrate 1 and the second stabilization layer 9, each of which has a large cross-sectional area occupying the oxide superconductor wire 10, are formed of metal and the impregnating resin and the insulation coating layer 7 are formed of resin. Therefore, stress causing delamination in the thickness direction of the oxide superconductor wire 10 is applied. In this case, the insulation coating layer 7 is in close contact with the second stabilization layer 9 with an appropriate adhesive force. Accordingly, when a strong force is applied in a direction causing delamination, the insulation coating layer 7 is peeled off from the second stabilization layer 9 before peeling occurs at the interface between the intermediate layer 2 and the superconductor layer 3. As a result, stress is reduced.

For this reason, even if the oxide superconductor wire 10 of the present embodiment is coiled and is then fixed with impregnating resin and cooled with a refrigerant, it is possible to obtain the oxide superconductor wire 10 and a superconducting coil whose superconducting characteristics do not deteriorate without delamination of the intermediate layer 2 and the superconductor layer 3.

Second Embodiment

Figure 2:
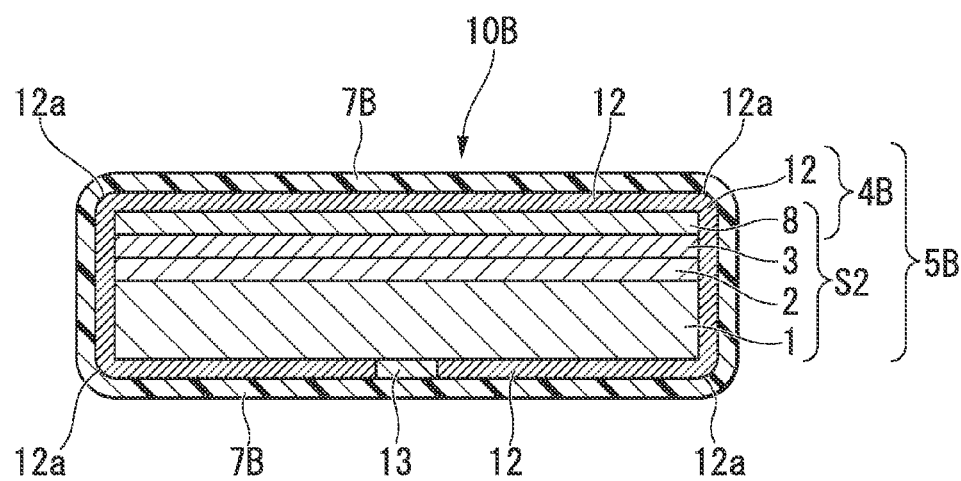
FIG. 2 is a schematic cross-sectional view showing a superconductor wire according to a second embodiment of the present invention.

FIG. 2 is a schematic cross-sectional view along the width direction of a superconductor wire according to a second embodiment of the present invention.

In a superconductor wire 10B shown in FIG. 2, a laminated substrate S2 is formed by laminating an intermediate layer 2, an oxide superconductor layer 3, and a first stabilization layer 8 in this order on one surface of a substrate 1, and has a rectangular cross-sectional shape. In addition, a superconducting laminate 5B includes the above-described laminated substrate S2 in the middle, and is formed by covering the periphery (almost the entire outer peripheral surface) of the above-described laminated substrate S2 with a second stabilization layer 12. The horizontal cross-sectional shape of the superconducting laminate 5B is an approximately rectangular shape. In addition, the superconductor wire 10B is formed by covering the entire outer peripheral surface of the superconducting laminate 5B with an insulation coating layer 7B. In the present embodiment, a metal stabilization layer 4B is configured to include the first stabilization layer 8 formed on the oxide superconductor layer 3 and the second stabilization layer 12 that covers almost the entire outer peripheral surface of the laminated substrate S2.

The second stabilization layer 12 of the present embodiment is formed of a metal material having high conductivity, and functions as a bypass, which commutates the current of the oxide superconductor layer 3, together with the first stabilization layer 8 when the oxide superconductor layer 3 is transitioned from the superconducting state to the normal conducting state. The second stabilization layer 12 having a metal tape shape is disposed along the peripheral surface of the laminated substrate S2 so as to have an approximately C-shaped cross-sectional shape, and is provided so as to cover almost the entire peripheral surface of the laminated substrate S2. More specifically, the second stabilization layer 12 is disposed so as to cover almost the entire periphery of the laminated substrate S2 except for a middle portion on a side of the other surface (surface on which the intermediate layer 2 is not formed) of the substrate 1. A portion that is not covered by the second stabilization layer 12 in the middle portion on the other surface side of the substrate 1 is covered by a solder layer 13 which is filled in a recess between two edges of the second stabilization layer 12. When the laminated substrate S2 and the second stabilization layer 12 are integrated using solder layer 13 as in the present embodiment, a solder layer may be provided between the laminated substrate S2 and the second stabilization layer 12.

As a metal material that forms the second stabilization layer 12, the metal material that forms the second stabilization layer 9 of the first embodiment described previously can be applied. Also for the thickness of the metal material, the same range can be selected. In addition, although not shown in FIG. 2, when the second stabilization layer 12 having a metal tape shape is integrated with the outer periphery of the laminated substrate S2 through the solder, a solder layer is present between the laminated substrate S2 and the second stabilization layer 12.

The superconductor wire 10B of the present embodiment is different from the superconductor wire 10 of the above first embodiment in that the second stabilization layer 12 covers almost the entire periphery excluding a portion where the solder layer 13 is provided on the outer peripheral surface of the laminated substrate S2.

In the superconductor wire 10B shown in FIG. 2, the same reference numerals are given to the same components as in the superconductor wire 10 shown in FIG. 1, and a detailed explanation thereof will be omitted here.

In the superconducting laminate 5B, a corner portion 12a of the second stabilization layer 12 on the cross section along the width direction is a curved surface having a radius of curvature. Therefore, when forming the insulation coating layer 7B, it is possible to apply and bake a resin onto the entire outer periphery including the corner portion 12a, and it is possible to form the insulation coating layer 7B that covers the entire outer periphery of the second stabilization layer 12. It is preferable that the radius of curvature of the corner portion 12a be set in a range of 15 to 150 μm.

The insulation coating layer 7B is formed by applying a resin on the entire outer periphery of the second stabilization layer 12 and then baking the resin. The resin that forms the insulation coating layer 7B is not particularly limited as long as a layer can be formed by baking, and the same resin material as the resin used in the superconductor wire 10 of the first embodiment can be utilized.

The outer surface of the second stabilization layer 12, that is, the peripheral surface of the second stabilization layer 12 shown in FIG. 2 is formed such that the maximum height (maximum height roughness) Rz (JIS B 0601:2001) is 890 nm or less. The maximum height Rz of the outer surface of the second stabilization layer 9 is preferably 887 nm or less, and more preferably in a range of 189 to 887 nm.

The surface roughness (arithmetic average roughness) Ra of the outer surface of the second stabilization layer 12 is preferably 80 nm or less. The surface roughness Ra of the outer surface of the second stabilization layer 12 is more preferably in the range of 30 to 77 nm. It is more preferable to satisfy the range of the surface roughness Ra described above after defining the maximum height of the outer surface of the second stabilization layer 12 in the range described above. In the present embodiment, the entire outer surface of the second stabilization layer 12 does not need to be formed in the range of the values of the maximum height Rz and the average roughness Ra described above. Since the second stabilization layer 12 of the present embodiment is provided in order to prevent a part of each of the intermediate layer 2 and the oxide superconductor layer 3 from being peeled off from the layer in close contact therewith, only the outer surface of the second stabilization layer 12 located above the position where the intermediate layer 2 and the superconductor layer 3 are laminated may be formed so as to have the maximum height or average roughness described above.

In the superconductor wire 10B of the present embodiment, it is possible to realize a structure in which the entire outer periphery including the corner portion 12a of the superconducting laminate 5B is completely covered by the insulation coating layer 7B. Accordingly, in the high-temperature superconductor wire 10B of the present embodiment, since the superconducting laminate 5B is sealed from the outside by the insulation coating layer 7B, it is possible to reduce the amount of moisture or the like penetrating the oxide superconductor layer 3. As a result, it is possible to suppress the deterioration of the superconducting characteristics. When the corner portion 12a is not a curved surface, resin around the corner portion falls off or becomes thin when the resin is applied. As a result, there is a possibility that an insulation coating layer required to cover the corner portion may not be formed. Therefore, it is preferable that the corner portion 12a be a curved surface to the extent that a resin is sufficiently filled therearound (resin is formed on the corner portion 12a).

In addition, when the oxide superconductor wire 10B is wound around a bobbin as a coil and is then fixed with impregnating resin and cooled to the critical temperature or lower with a refrigerant, stress is applied due to a difference in the thermal expansion between metal and resin. Accordingly, there is a possibility that stress causing delamination along the thickness direction of the oxide superconductor wire 10B will be applied. When a strong force is applied in a direction causing delamination, the insulation coating layer 7B is peeled off from the second stabilization layer 12 before each of the intermediate layer 2 and the superconductor layer 3 starts peeling from the layer in close contact therewith. As a result, the stress is reduced. That is, the outer surface of the second stabilization layer 12 is adjusted to fall within the appropriate maximum height range or the appropriate surface roughness range as described above, and the insulation coating layer 7B adheres to the second stabilization layer 12 with appropriate adhesion. Therefore, the above-described stress can be reduced by making the insulation coating layer 7B peel off from the second stabilization layer 12 without a part of each of the intermediate layer 2 and the superconductor layer 3 being peeled off from the layer in close contact therewith.

For this reason, even if the oxide superconductor wire 10B of the present embodiment is coiled and is then fixed with impregnating resin and cooled with a refrigerant, delamination of the intermediate layer 2 and the superconductor layer 3 from the layer in close contact therewith does not occur. Therefore, it is possible to obtain the oxide superconductor wire 10B and a superconducting coil whose superconducting characteristics do not deteriorate.

Third Embodiment

Figure 3:
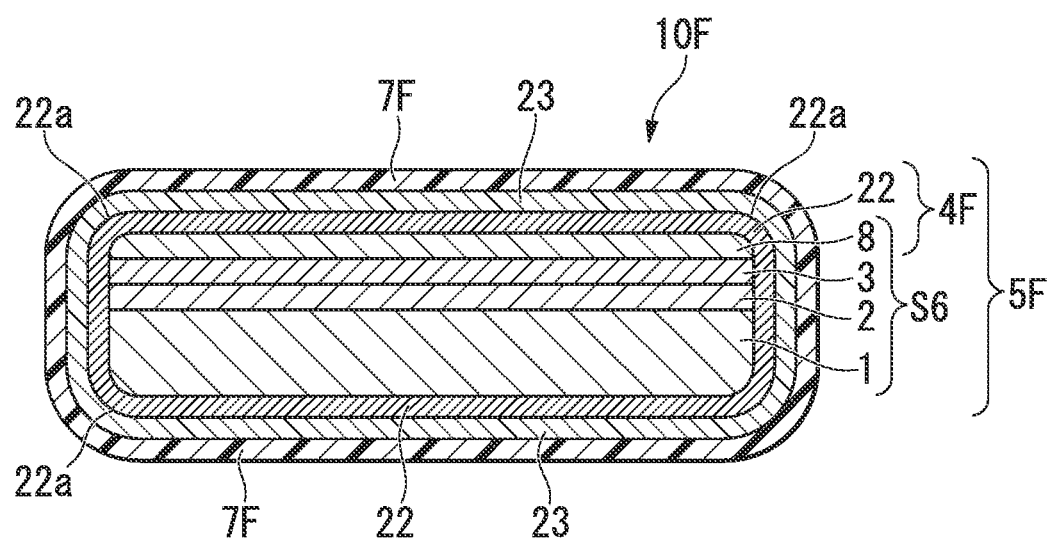
FIG. 3 is a schematic cross-sectional view showing a superconductor wire according to a third embodiment of the present invention.
Figure 4:
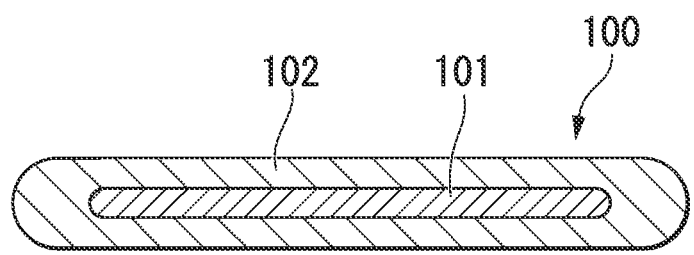
FIG. 4 is a schematic cross-sectional view showing an example of the structure of a Bi-based superconductor wire.
Figure 5:
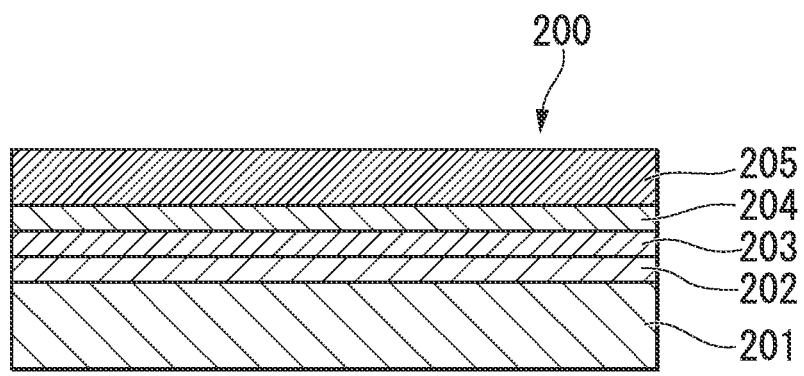
FIG. 5 is a schematic cross-sectional view showing an example of the structure of a rare earth element-based superconductor wire.

FIG. 3 is a schematic cross-sectional view along the width direction of a high-temperature superconductor wire according to a third embodiment of the present invention.

In a high-temperature superconductor wire 10F shown in FIG. 3, a laminated substrate S6 is formed by laminating an intermediate layer 2, an oxide superconductor layer 3, and a first stabilization layer 8 in this order on a substrate 1. In addition, a superconducting laminate 5F includes the laminated substrate S6 in the middle, and is formed by covering the entire outer periphery of the laminated substrate S6 with a second stabilization layer 22. The horizontal cross-sectional shape of the superconducting laminate 5F is an approximately rectangular shape. An insulation coating layer 7F that covers the entire outer peripheral surface of the superconducting laminate 5F is formed on the outer peripheral surface of the superconducting laminate 5F with a bonding layer 23 formed of tin interposed therebetween. The bonding layer 23 may be formed on the entire outer peripheral surface of the superconducting laminate 5F. Although the entire outer periphery of the laminated substrate S6 is covered by the second stabilization layer 22 in FIG. 3, the present invention is not limited thereto. As in the second embodiment, a part of the laminated substrate S6 may not be covered, and solder may be formed in the part. As in the second embodiment, when the laminated substrate S6 and the second stabilization layer 22 are integrated using solder, a solder layer may be provided between the laminated substrate S6 and the second stabilization layer 22. In addition, the material forming the bonding layer 23 is not limited to tin, and it is possible to use solder. In the superconductor wire 10F shown in FIG. 3, the same reference numerals are given to the same components as in the superconductor wire 10 shown in FIG. 1, and a detailed explanation thereof will be omitted here.

In the superconductor wire 10F shown in FIG. 3, the maximum height (maximum height roughness) Rz of the peripheral surface of the bonding layer 23 is set to 890 nm or less.

The maximum height of the outer surface of the bonding layer 23 is preferably 887 nm or less, and more preferably in the range of 189 to 887 nm.

The surface roughness Ra of the outer surface of the bonding layer 23 is preferably 80 nm or less.

The surface roughness Ra of the outer surface of the bonding layer 23 is more preferably in the range of 30 to 77 nm. It is more preferable that the outer surface of the bonding layer 23 satisfy the range of the maximum height Rz described above and satisfy the range of the surface roughness Ra described above.

In the present embodiment, the entire outer surface of the bonding layer 23 does not need to be formed so as to have the maximum height and the average roughness described above. In the present embodiment, in order to prevent each of the intermediate layer 2 and the oxide superconductor layer from being peeled off from the layer in close contact therewith, only the outer surface of the bonding layer 23 located above the position where the intermediate layer 2 and the superconductor layer 3 are laminated may be formed so as to have the maximum height or average roughness described above.

In the superconducting laminate 5F having an approximately rectangular cross-sectional shape, a corner portion 22a on the cross section along the width direction of the second stabilization layer 22 is a curved surface having a radius of curvature. Therefore, when forming the insulation coating layer 7F, it is possible to completely apply and bake a resin onto the entire outer periphery of the second stabilization layer 22 including the corner portion 22a, and it is possible to form the insulation coating layer 7F that covers the entire outer periphery of the superconducting laminate 5F. It is preferable that the radius of curvature of the corner portion 22a be set in the range of 15 to 150 μm.

Also in the structure of the third embodiment, it is possible to obtain the same effects as in the structure of the first and second embodiments described above.

That is, when a strong force is applied in a direction causing delamination, the insulation coating layer 7F is peeled off from the outer surface of the bonding layer 23 before each of the intermediate layer 2 and the superconductor layer 3 is peeled from the layer in close contact therewith. As a result, stress is reduced.

For this reason, even if the oxide superconductor wire 10F of the present embodiment is coiled and is then fixed with impregnating resin and cooled with a refrigerant, it is possible to obtain the oxide superconductor wire 10F and a superconducting coil whose superconducting characteristics do not deteriorate without delamination of the intermediate layer 2 and the superconductor layer 3 from the layer in close contact therewith.

EXAMPLES

Hereinafter, the present invention will be described in more detail by way of examples, but the present invention is not limited to these examples.

$Al_2O_3$ (diffusion barrier layer; 150 nm in thickness) was formed on a Hastelloy (product name manufactured by U.S.

Haynes Co.) substrate having a tape shape with a width of 5 mm and a thickness of 0.1 mm using a sputtering method, and $Y_2O_3$ (bed layer; 20 nm in thickness) was formed on the $Al_2O_3$ layer using an ion beam sputtering method. Then, MgO (metal oxide layer; 10 nm in thickness) was formed on the bed layer using an ion beam assisted deposition method (IBAD method), and $CeO_2$ (cap layer) with a thickness of 1.0 μm was formed on the MgO layer using a pulsed laser deposition method (PLD method). Then, $GdBa_2Cu_3O_7$ (oxide superconductor layer) with a thickness of 1.0 μm was formed on the $CeO_2$ layer using the PLD method, and an Ag layer (first stabilization layer) with a thickness of 2 μm was formed on the oxide superconductor layer using a sputtering method, thereby manufacturing a plurality of laminates.

Then, a Cu tape (second stabilization layer) with a thickness of 0.1 mm or a Cu tape with a thickness of 0.05 mm was bonded to the Ag layer of these laminates using tin solder (melting point of 230° C.), thereby manufacturing a superconducting laminate with a width of 5 mm and a thickness of 0.19 mm or 0.14 mm.

Then, a plurality of superconductor wires of the laminated structure shown in FIG. 1 were manufactured by forming an insulation coating layer with a thickness of 20 μm on each manufactured superconducting laminate by baking the formal resin (for example, Vinylec F manufactured by Chisso Corporation) at a temperature of 185° C., thereby obtaining samples of examples 1 and 2.

In addition, a superconducting laminate was formed by covering a laminate with a copper plating layer with a thickness of 20 μm instead of the copper tape with a thickness of 0.1 mm or 0.05 mm in the above example, and an insulation coating layer of the same formal resin as in the examples 1 and 2 was formed on the superconducting laminate, thereby obtaining a sample of a comparative example 1.

Next, a superconductor wire of the structure in which a forming of a roll of a copper tape having a surface subjected to tin plating was coated around a superconducting laminate instead of the copper tape with a thickness of 0.1 mm or 0.05 mm in the example described above was manufactured, thereby obtaining a sample of an example 3. In the example 3, a base of the insulation coating layer to be described later is subjected to tin plating.

For each of the manufactured superconductor wire samples, evaluation of superconducting characteristics and a peeling test was performed.

For the measurement of the superconducting characteristics, critical current density values at 77K were measured for a superconducting laminate before the baking of formal resin and for a superconductor wire after baking, and the ratio of the critical current density values before and after the baking of the formal resin was calculated.

The peeling test was performed according to a stud-pull method using a cylindrical pin formed of aluminum of φ2.7 mm. An adhesive was attached to the tip of the pin and was pressed against the center of the upper surface of the insulation coating layer, and heating and curing were performed. Then, the pin was pulled in a direction away from the insulation coating layer in the axial direction, and the breaking strength at that time was set as the peeling strength.

TABLE 1

| Items | Comparative example 1 | Example 1 | Example 2 | Example 3 |
|---|---|---|---|---|
| Substrate thickness (μm) | 100 | 100 | 100 | 100 |
| Stabilization copper thickness (μm) | 20 | 50 | 100 | 20 |
| Stabilization copper layer structure | plating | bonding | bonding | forming |
| Wire width (mm) | 5 | 5 | 5 | 5 |
| Critical current measurement results before and after test | 0.97 | 0.95 | 0.99 | 0.99 |
| Maximum height Rz (nm) | 898 | 550 | 220 | 189 |
|  | 1207 | 360 | 554 | 610 |
|  | 2375 | 685 | 758 | 887 |
| Surface roughness Ra (nm) | 83.7 | 51.0 | 30.1 | 30.2 |
|  | 145.2 | 36.4 | 50.8 | 43.7 |
|  | 186.4 | 63.1 | 66.2 | 76.5 |
| Peeling test result (N = 2) (MPa) | 54.1 | 23.6 | 9.8 | 16.9 |
|  | 36.2 | 18.2 | 10.2 | 4.9 |
| Evaluation | X (delamination) | ○ (no delamination of superconducting layer and intermediate layer) | | |

From the result shown in Table 1, in the stabilization layer of copper as a base of the resin coating layer, the value of the peeling strength of the sample of the comparative example 1, in which the value of the maximum height Rz of the surface was large, was large. However, a part of the intermediate layer or the superconductor layer was peeled off. This is interpreted as follows. If the unevenness of the copper stabilization layer surface is large, the insulation coating layer is brought into close contact with the stabilization layer by the anchor effect due to the unevenness of the stabilization layer. Accordingly, when the resin coating layer is strongly pulled outward by the pin, adhesion between each of the intermediate layer and the superconductor layer and the layer in close contact therewith becomes weak before peeling occurs at the interface between the resin coating layer and the stabilization layer. As a result, each of the intermediate layer and the superconductor layer is peeled off of the layer in close contact therewith.

In contrast, in all of the samples of the examples 1 to 3 in which the value of the maximum height Rz was smaller than that in the sample of the comparative example 1, the insulation coating layer was peeled off from the stabilization layer, but there was no peeling in a portion with which the intermediate layer and the superconductor layer were in close contact. The insulation coating layer is formed for insulation. Accordingly, even if peeling occurs slightly, it is possible to obtain the insulation effect if the insulation coating layer is present on the stabilization layer of Cu. For this reason, there is no usage problem. In contrast, if peeling occurs in a portion of the intermediate layer or the superconductor layer, the superconductor layer is partially damaged. This has an adverse effect on the superconducting characteristics.

From the test result shown in Table 1, it can be seen that a part of each of the intermediate layer and the superconductor layer does not peel off from the layer in close contact therewith if the maximum height Rz of the surface of the stabilization layer of Cu that forms a base of the resin coating layer is 890 nm or less. In addition, from the result shown in Table 1, if Rz of the surface of the stabilization layer is 887 nm or less, each of the intermediate layer and the superconductor layer does not peel off from the layer in close contact therewith. Therefore, in view of the results of the examples 1 to 3, if the maximum height Rz of the surface of the stabilization layer is set to fall within the range of 189 to 887 nm, a part of each of the intermediate layer and the superconductor layer does not peel off from the layer in close contact therewith. In addition, since the resin coating layer is easily peeled off of the stabilization layer of Cu as the maximum height Rz decreases, the lower limit of the maximum height Rz is not particularly defined in order to protect the intermediate layer and the superconductor layer and to make the insulation coating layer peeled from the stabilization layer of Cu.

In addition, from the test result shown in Table 1, it can be seen that a part of each of the intermediate layer and the superconductor layer does not peel off from the layer in close contact therewith if the average roughness Ra of the surface of the copper stabilization layer as a base of the resin coating layer is 80 nm or less. In addition, from the test result shown in Table 1, if the average roughness Ra is 77 nm or less, a part of each of the intermediate layer and the superconductor layer does not peel off from the layer in close contact therewith. In view of the results of the examples 1 to 3, if the average roughness Ra is set to fall within the range of 30 to 77 nm, a part of each of the intermediate layer and the superconductor layer does not peel off from the layer in close contact therewith.

In the comparative example 1, an example is shown in which a copper plating layer is used as the second stabilization layer. However, as long as the maximum height Rz and the average roughness Ra of the copper plating layer are within the range described above, using the copper plating layer for the present invention is not excluded, and it is possible to use a copper plating layer satisfying the above range.

Next, a design example when manufacturing a superconducting coil using the superconductor wire having the structure shown in the above example 3 will be described.

Using a superconductor wire with a wire width of 10 mm and a thickness of 0.19 mm (0.1 mm-thickness Hastelloy substrate+2 μm-thickness stabilization layer of Ag+20 μm-thickness stabilization layer of copper and the coating thickness of 20 μm by the insulation coating layer), a double pancake type coil with an inner diameter of 70 mm and a height of 20.5 mm was manufactured as a superconducting coil. In addition, a diffusion barrier layer, a bed layer, a metal oxide layer, a cap layer, and an oxide superconductor layer formed on the substrate are the same as the respective layers of the above third embodiment.

A superconducting coil was manufactured by winding the coil on a reel, which was formed of GFRP, with the number of turns of the coil being 200 turns (100 turns×2).

Each parameter of the above superconducting coil is written in the following Table 2.

As a conventional example, a superconductor wire was prepared in which an insulation coating layer was formed by winding two polyimide tapes having a thickness of 12.5 μm so as to overlap each other instead of coating using the formal resin, and a superconducting coil that was formed under the same conditions as for the above-described super- conducting coil using the superconductor wire was compared with the structure of the example 3.

The above result is written in the following Table 2.

TABLE 2

| Items | Conventional example 1 | Example 1 |
|---|---|---|
| Insulation and impregnation method | Winding two polyimide tapes of 12.5 μm so as to overlap each other | Coat thickness 20 μm |
| Current (A) | 300 | 300 |
| Coil current density (A/mm$^2$) | 142.9 | 151.8 |
| Magnetic field of coil center (T) (at 20 K) | 0.828 | 0.836 |
| Inner diameter of coil (mm) | 70 | 70 |
| Outer diameter of coil (mm) | 110 | 110 |
| Coil height (mm) | 20 | 19 |
| Number of turns/layer | 100 | 100 |
| Number of layers | 2 | 2 |
| Length of wire used (m) | 56.2 | 55.9 |

As in the comparison result shown in Table 2, it could be seen that the current density of the superconducting coil in the case of the superconductor wire including the insulation coating layer formed by baking the formal resin could be improved by 6% compared with that in the case of the superconductor wire with a wound polyimide tape.

This difference occurred because the insulating layer in the coil of the example could become thin even if the coil height, inner and outer diameters of the coil, the number of turns, and the number of layers were almost the same and accordingly the coil current density was improved.

Manufacturing Example of a Superconducting Coil

A superconductor wire (wire critical current Ic=205 A to 221 A (77K, in a self-magnetic field)) with a width of 5 mm and a thickness of 0.19 mm (Hastelloy substrate thickness: 0.1 mm, thickness of the first stabilization layer of Ag: 2 μm, thickness of the stabilization copper layer: 20 μm, and coating layer thickness: 20 μm) was prepared. The superconductor wire was wound by about 31 turns on the surface of a reel formed of GFRP, epoxy resin was supplied to the winding portion by vacuum impregnation, and the superconductor wire of the reel surface was fixed by impregnating resin, thereby obtaining a superconducting coil example 1.

Before and after the vacuum impregnation of epoxy resin, the critical current Ic of the superconductor wire in the liquid nitrogen was measured. Two superconducting coils were manufactured. When there was at least one superconducting coil in which the critical current density value was reduced by 10% or more before and after the impregnation of the epoxy resin, an X mark was given as the evaluation. When a reduction in the critical current was not seen in any of the two superconducting coils, an O mark was given as the evaluation.

For comparison, as a conventional example, a superconductor wire (wire critical current Ic=492 to 520 A (77K, in a self-magnetic field)) with a width of 10 mm and a thickness of 0.19 mm (Hastelloy substrate thickness: 0.1 mm, thickness of the first stabilization layer of Ag: 2 μm, thickness of the stabilization copper plating layer: 20 μm, and coating layer thickness: 20 μm) was prepared.

The superconductor wire was wound by about 31 turns on the surface of a reel formed of GFRP, epoxy resin was supplied to the winding portion by the vacuum impregnation, and the superconductor wire of the reel surface was fixed by impregnating resin, thereby obtaining a superconducting coil conventional example 1.

Before and after the vacuum impregnation of epoxy resin, the critical current Ic of the superconductor wire in the liquid nitrogen was measured. Two superconducting coils were manufactured. When there was at least one superconducting coil in which the critical current density value was reduced by 10% or more before and after the impregnation of the epoxy resin, an X mark was given as the evaluation. When a reduction in the critical current was not seen in any of the two superconducting coils, an O mark was given as the evaluation.

TABLE 3

| Items | Conventional example 1 of superconducting coil | Example 1 of superconducting coil |
|---|---|---|
| Wire | 10 mm width 20 μm copper plating | 5 mm width 20 μm tin plating Copper forming |
| Insulation method | Formal coat thickness 20 μm | Formal coat thickness 20 μm |
| Inner diameter of coil (mm) | 60 | 60 |
| Outer diameter of coil (mm) | 78 | 77 |
| Coil height (mm) | 10.5 | 5.4 |
| Number of turns/layer | 31 | 31 |
| Number of layers | 1 | 1 |
| Length of wire used (m) | 7.5 | 7.5 |
| Maximum height Rz | 898 1207 2375 | 189 610 887 |
| Average roughness Ra | 83.7 145.2 186.4 | 30.2 43.7 76.5 |
| Evaluation result of superconducting characteristics | X | O |

In the superconducting coil shown in Table 3, each superconductor wire shown in the above Table 1 is used for coil fabrication. Accordingly, the value of the maximum height Rz and the value of the surface roughness Ra are the same as those in the case of the superconductor wire of Table 1.

As shown in Table 3, the sample of the example 1 showed excellent results without a reduction in the critical current.

Since the superconductor wire that forms the superconducting coil of the conventional example 1 has a width of 10 mm and the superconductor wire that forms the superconducting coil of the example 1 has a width of 5 mm, the Ic values of both the wires are different.

The present invention provides a superconductor wire that can be used for superconducting coils used in various superconducting devices, such as a superconducting motor and a fault current limiter, for example.

What is claimed is:

1. A superconductor wire, comprising:
a superconducting laminate that includes: a substrate; and an intermediate layer, a superconductor layer, and a metal stabilization layer which are laminated on the substrate; and
an insulation coating layer that covers an outer surface of the superconducting laminate and is formed by baking a resin material,
wherein a maximum height Rz of at least a part of the outer surface of the superconducting laminate covered with the insulation coating layer is 890 nm or less.

2. The superconductor wire according to claim 1,
wherein surface roughness Ra of at least a part of the outer surface of the superconducting laminate covered with the insulation coating layer is 80 nm or less.

3. The superconductor wire according to claim 1,
wherein at least a part of the outer surface of the superconducting laminate includes an outer surface of a layer laminated on an outer side of the superconductor layer.

4. The superconductor wire according to claim 2,
wherein at least a part of the outer surface of the superconducting laminate includes an outer surface of a layer laminated on an outer side of the superconductor layer.

5. The superconductor wire according to claim 1,
wherein the metal stabilization layer includes a first stabilization layer and a second stabilization layer laminated on the first stabilization layer, and
the second stabilization layer is formed by a metal tape or the metal tape and a bonding material, and an outer surface of the metal tape or an outer surface of the bonding material is covered with the insulation coating layer.

6. The superconductor wire according to claim 2,
wherein the metal stabilization layer includes a first stabilization layer and a second stabilization layer laminated on the first stabilization layer, and
the second stabilization layer is formed by a metal tape or the metal tape and a bonding material, and an outer surface of the metal tape or an outer surface of the bonding material is covered with the insulation coating layer.

7. The superconductor wire according to claim 3,
wherein the metal stabilization layer includes a first stabilization layer and a second stabilization layer laminated on the first stabilization layer, and
the second stabilization layer is formed by a metal tape or the metal tape and a bonding material, and an outer surface of the metal tape or an outer surface of the bonding material is covered with the insulation coating layer.

8. The superconductor wire according to claim 4,
wherein the metal stabilization layer includes a first stabilization layer and a second stabilization layer laminated on the first stabilization layer, and
the second stabilization layer is formed by a metal tape or the metal tape and a bonding material, and an outer surface of the metal tape or an outer surface of the bonding material is covered with the insulation coating layer.

9. The superconductor wire according to claim 1,
wherein the metal stabilization layer includes a first stabilization layer coated on the superconductor layer, and a second stabilization layer provided so as to surround a periphery of the substrate, the intermediate layer, the superconductor layer, and the first stabilization layer, the second stabilization layer being formed by a metal tape, and
an outer surface of the second stabilization layer is covered with the insulation coating layer.

10. The superconductor wire according to claim 2,
wherein the metal stabilization layer includes a first stabilization layer coated on the superconductor layer, and a second stabilization layer provided so as to surround a periphery of the substrate, the intermediate layer, the superconductor layer, and the first stabilization layer, the second stabilization layer being formed by a metal tape, and
an outer surface of the second stabilization layer is covered with the insulation coating layer.

11. The superconductor wire according to claim 3,
wherein the metal stabilization layer includes a first stabilization layer coated on the superconductor layer, and a second stabilization layer provided so as to surround a periphery of the substrate, the intermediate layer, the superconductor layer, and the first stabilization layer, the second stabilization layer being formed by a metal tape, and an outer surface of the second stabilization layer is covered with the insulation coating layer.

12. The superconductor wire according to claim 4,
wherein the metal stabilization layer includes a first stabilization layer coated on the superconductor layer, and a second stabilization layer provided so as to surround a periphery of the substrate, the intermediate layer, the superconductor layer, and the first stabilization layer, the second stabilization layer being formed by a metal tape, and an outer surface of the second stabilization layer is covered with the insulation coating layer.

13. The superconductor wire according to claim 1,
wherein the metal stabilization layer includes a first stabilization layer coated on the superconductor layer, a second stabilization layer provided so as to surround a periphery of the substrate, the intermediate layer, the superconductor layer, and the first stabilization layer, and a bonding layer laminated on an outer surface of the second stabilization layer, and an outer surface of the bonding layer is covered with the insulation coating layer.

14. The superconductor wire according to claim 2,
wherein the metal stabilization layer includes a first stabilization layer coated on the superconductor layer, a second stabilization layer provided so as to surround a periphery of the substrate, the intermediate layer, the superconductor layer, and the first stabilization layer, and a bonding layer laminated on an outer surface of the second stabilization layer, and an outer surface of the bonding layer is covered with the insulation coating layer.

15. The superconductor wire according to claim 3,
wherein the metal stabilization layer includes a first stabilization layer coated on the superconductor layer, a second stabilization layer provided so as to surround a periphery of the substrate, the intermediate layer, the superconductor layer, and the first stabilization layer, and a bonding layer laminated on an outer surface of the second stabilization layer, and an outer surface of the bonding layer is covered with the insulation coating layer.

16. The superconductor wire according to claim 4,
wherein the metal stabilization layer includes a first stabilization layer coated on the superconductor layer, a second stabilization layer provided so as to surround a periphery of the substrate, the intermediate layer, the superconductor layer, and the first stabilization layer, and a bonding layer laminated on an outer surface of the second stabilization layer, and an outer surface of the bonding layer is covered with the insulation coating layer.

17. A superconducting coil formed by the superconductor wire according to claim 1.

* * * * *